Figure 1:
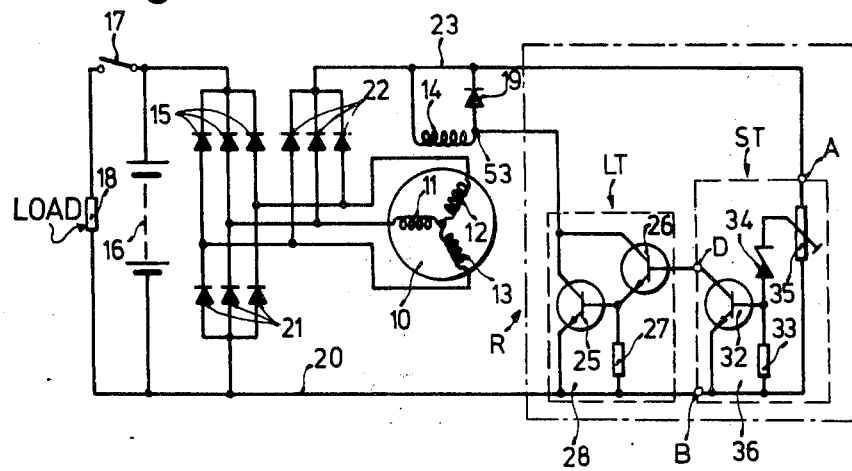

United States Patent [19]

Gansert et al.

[11] 4,128,802

[45] Dec. 5, 1978

[54] SOLID STATE VOLTAGE REGULATED AUTOMOTIVE-TYPE ELECTRICAL POWER SUPPLY SYSTEM

[75] Inventors: Willi Gansert, Kornwestheim; Dietrich Bergfried, Böblingen; Gert Heinrich, Ludwigsburg; Dietmar Schnepf, Esslingen; Harry Slansky, Muhlacker, Grossglattbach; Eberhard Pflüger, Leonberg; Jean Dorkel, Reutlingen-Betzingen, all of Germany

[73] Assignee: Robert Bosch GmbH, Stuttgart, Germany

[21] Appl. No.: 775,284

[22] Filed: Mar. 7, 1977

[30] Foreign Application Priority Data

Mar. 11, 1976 [DE] Fed. Rep. of Germany ....... 2610137

[51] Int. Cl.² ..................... H02P 9/30; H01L 25/00
[52] U.S. Cl. ..................... 322/28; 174/52 H; 357/75; 361/421
[58] Field of Search ............... 174/52 H, 50.5, 50.52, 174/50.53, 50.54; 357/75; 322/28; 361/421

[56] References Cited

U.S. PATENT DOCUMENTS

| 3,532,962 | 10/1970 | Balcke et al. | 322/28 |
| 3,539,907 | 11/1970 | Linstedt | 322/28 |
| 3,582,762 | 6/1971 | Mori et al. | 322/28 |
| 3,588,617 | 6/1971 | Grozinger et al. | 322/28 UX |
| 3,876,926 | 4/1975 | Schott et al. | 322/28 |
| 4,032,964 | 6/1977 | Boeters | 357/74 |

Primary Examiner—Robert J. Hickey
Attorney, Agent, or Firm—Flynn & Frishauf

[57] ABSTRACT

A multi-phase generator has a separately excited shunt field which is controlled by a voltage regulator. A free-wheeling diode is connected in parallel with the field. The voltage regulator is included in a single, hermetically sealed housing which has a metal base plate forming one terminal of the voltage regulator; two insulated terminals project from the voltage regulator and are sealed, in insulated relation, through the housing, preferably the base plate. Three monolithic semi-conductor integrated circuit (IC) chips are located within the sealed housing, two of them soldered to the base plate so that one of the semi-conductor connections of the chip are directly connected to the base plate, the connection being for the collector of the power transistor and the anode of the free-wheeling diode, the control portion of the voltage regulator being secured to a ceramic plate which is attached to the base plate, other terminals from the voltage regulator are being effected internally, by bonding wires, and to the two externally excessible contacts, so that the entire assembly is simple, readily manufactured, and requires little assembly, labor and time for connection to an alternator structure.

10 Claims, 4 Drawing Figures

SOLID STATE VOLTAGE REGULATED AUTOMOTIVE-TYPE ELECTRICAL POWER SUPPLY SYSTEM

Cross reference to related application, assigned to the assignee of the present application: U.S. Ser. 775,283 Filed Mar. 7, 1977 Gansert and Rittmannsberger, "Voltage Regulator for Generators".

The present invention relates to a solid state voltage regulated electrical power supply system for automotive vehicles, and more particularly for such a system which uses an alternator with a shunt field, in which the alternator is subject to wide swings in drive speed.

Automotive electrical supply systems to supply the on-board network of automotive vehicles usually use multiphase alternators with shunt fields, in which the shunt field is intermittently excited in order to control the output voltage of the alternator under widely varying speed conditions. It is customary to include a free-wheeling, or free-running bipass diode in a circuit connected in parallel to the shunt field, to permit current flow through the shunt field even after the regulator switch has interrupted current supply from the on-board network of the vehicle to the shunt field, and to prevent inductive kicks.

Previously used and proposed voltage regulators usually employ a power transistor, or a power transistor combination in the form of a Darlington transistor which controls current flow to the shunt field. The power transistor itself is controlled, in turn, by a regulator or control section which provides control current to the power transistor in dependence on output voltage of the generator with respect to a reference. The reference is customarily supplied by a Zener diode, connected to the output voltage of the generator, or to a voltage proportional thereto.

Generators of the type to which the present invention relates have been described in the literature, for example British Pat. No. 1,101,827, in which a silicon chip is used to form the power transistor in planar technology; a second silicon chip forms the control portion or control section, likewise constructed as a monolithic integrated circuit (IC). Such semiconductor chips are tiny; their longitudinal length along the edges may be only a few milimeters. These chips require different connecting technology than discrete circuit elements which can be secured, in known manner, to printed circuit boards or similar current conductors.

It is an object of the present invention to combine the free-wheeling diode used in the current supply system, or network for the vehicle with the voltage regulator and to provide, overall, a system which is particularly simple to assemble and in which the necessary connections can be easily made.

SUBJECT MATTER OF THE PRESENT INVENTION

Briefly, the free-wheeling diode is placed on a separate third chip and included within the voltage regulators. The voltage regulator, itself, is placed in a single sealed housing, together with the free-wheeling diode, so that the single housing will include three chips — the power semi-conductor portion, the control section for the power semi-conductor and the free-wheeling diode. The housing preferably has a metallic bottom plate which forms a common connecting point for one of the main current terminals of the power semi-conductor, typically the collector of the power transistor and for one of the terminals of the free-wheeling diode, typically the anode thereof. This connection can be directly connected, electrically, to the shunt field winding of the alternator. Further connections are formed by two projecting terminals, sealed through the housing in insulated relation thereto, one being a connection to the emitter of the semi-conductor power transistor and the other forming the cathode connection of the free-wheeling shunt diode, for connection to the other terminal of the field winding.

In accordance with a feature of the invention, the semi-conductor chips forming the power transistor and the free-wheeling diodes are in good electrical and heat conductive contact with the metallic socket plate, preferably by being soldered or bonded thereto; the semi-conductor chip carrying the regulator or control portion is preferably secured to a surface of a small ceramic plate which, in turn, is secured with its other surface to the socket plate of the housing.

Accompanying Drawings

Figure 2:
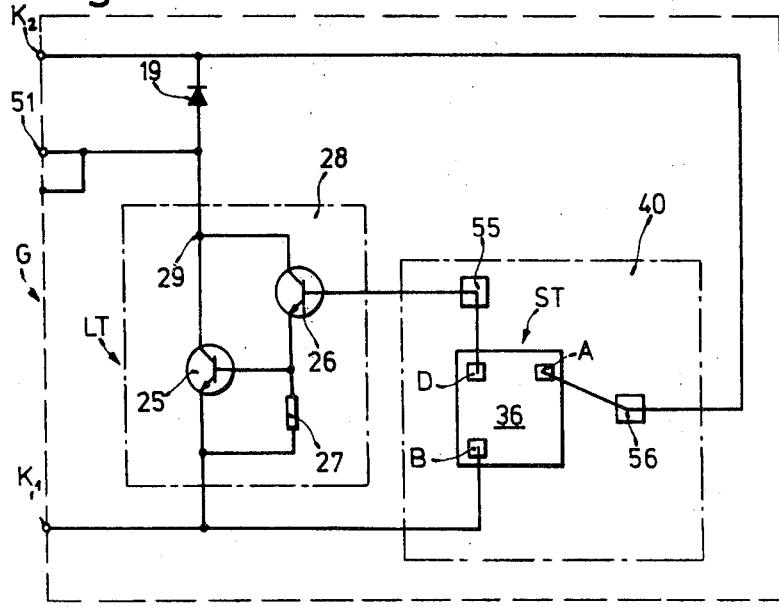
Figure 3:
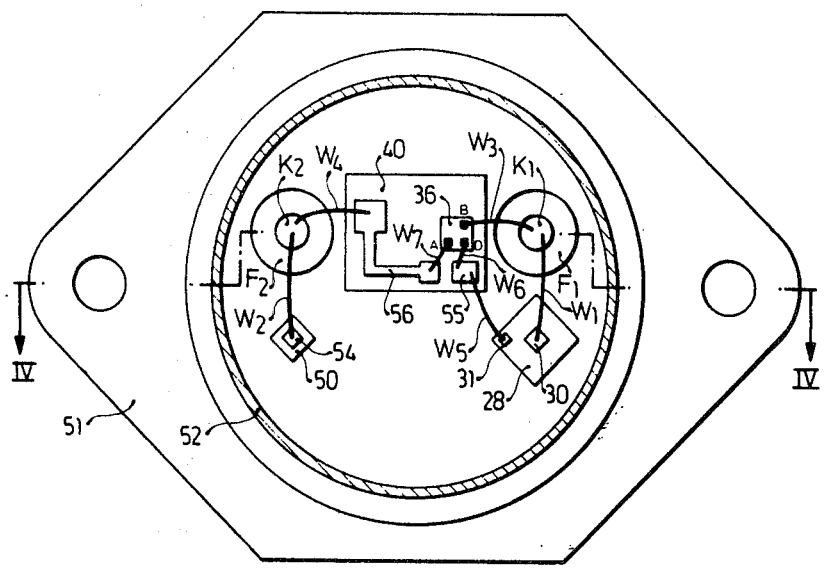
Figure 4:
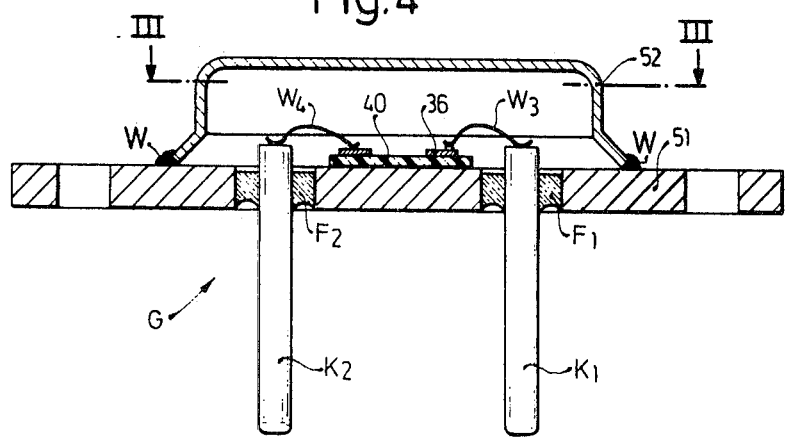

Illustration of the invention, by way of example:

FIG. 1 is a schematic electrical circuit diagram of an automotive electric power supply system using a shunt-excited alternator, and also showing the free-wheeling diode and the voltage regulator therefor;

FIG. 2 is a circuit diagram of the voltage regulator and free-wheeling diode, to an enlarged scale and illustrating in schematic representation the arrangement of the components of the regulator and the free-wheeling diode, in which the control portion of the regulator is schematically represented as a semi-conductor chip located on a ceramic plate which, at its topside, has three electrical terminals;

FIG. 3 is a top view of the housing with the cover plate removed along line III—III of FIG. 4, and illustrating the spatial relationship of the various electrical circuit components, and the connections of the components within the housing; and FIG. 4 is a vertical section of the voltage regulator-free-wheeling diode combination of FIG. 3 along line IV—IV of FIG. 3; it is to be noted that the section line is offset.

The voltage regulator R is intended for combination with a three phase alternator 10 (FIG. 1) having three armature windings 11, 12, 13 which are preferably fixed in the machine and a rotating field 14. The field is driven by the engine (not shown) of an automotive vehicle as wellknown, by a drive pulley (not shown). Each one of the armature windings 11, 12, 13 is connected to positive diodes 15 which, in turn, are connected to the positive terminal of a nominal 12.6V battery 16, forming the battery customarily used with automotive vehicles. Switch 17 can connect the output from the battery 16 to loads, schematically indicated at 18. These loads are the usual loads in automotive vehicles, such as the ignition system, headlights, applicances, and the like. The negative bus 20 is connected to the negative terminal of the battery 16. Negative diodes 21 connect the three armature windings 11, 12, 13 to the negative bus 20. The diodes 15 and 21 carry full load current. Exciter current is obtained from the armature windings 11, 12, 13 by rectification in separate exciter diodes 22. The exciter current is controlled by the voltage regulator R and applied to the field coil 14 through the voltage regulator in a manner that the current through the shunt field 14 is matched to the drive speed and to the loading on the generator, to provide an average value — with respect to time — which results in the desired output voltage from the armature windings 11, 12, 13. The exciter diodes 22 are connected to a positive bus 23 which, in turn, is connected to the voltage regulator. A voltage will arise between the positive exciter bus 23 and the negative terminal 20 which is proportional to the power output voltage delivered by the alternator through rectifiers 15, 21 to the battery. This voltage is to be maintained by the voltage regulator R at the value of about 14V, independent of speed of the alternator 10, and loading placed thereon.

The voltage regulator R has a power semi-conductor LT, constructed as a Darlington transistor, forming a power transistor. A control portion or control section ST is provided which controls the operation of the Darlington transistor LT. Both the power semi-conductor LT as well as the control section ST are formed as monolithic integrated circuits.

Darlington transistor LT has a final output transistor 25 and a npn driver transistor 26, interconnected in the wellknown Darlington circuit. A resistor 27 is connected between the base of transistor 25 and the emitter thereof. The Darlington transistor itself is formed as a monolithic integrated circuit on a first semi-conductor chip 28. The chip is entirely metallized at its lower side. This metallization forms the collector terminal of the Darlington transistor semi-conductor LT. The topside of the chip is formed with a metallic circuit connection 30 (FIG. 3) for the emitter and a metallic terminal 31 for the base of the Darlington driver transistor 26, and forming the control terminal for the Darlington transistor combination LT.

The control section ST has a npn control transistor 32, a resistor 33 connected in parallel between the base and emitter of transistor 32, and a Zener diode 34 forming a voltage reference level, connected to the tap or slider point of a potentiometer 35, forming a voltage divider. The emitter of control transistor 32 is connected to the negative bus 20; the collector of transistor 32 is connected to the base terminal 31 of the Darlington transistor combination LT. The Zener diode 34 has its anode connected to the base of control transistor 32 and its cathode to the tap of the voltage divider 35. One free terminal of the voltage divider 35 is connected to positive exciter bus 32, the other is connected to the negative bus 20. The control section ST is a monolithic integrated circuit. The Darlington transistor combination LT likewise is a monolithic integrated circuit. The control IC is located on a second semi-conductor chip 36. In contrast to the Darlington transistor chip 28, however, all externally accessible terminals A, B and D (FIG. 1) are located at the topside of the chip 36 (see FIGS. 2 and 3). Self excitation of the alternator 10, upon starting, requires that the power semi-conductor LT is conductive and control transistor 32 blocked, or effectively blocked, when the alternator is stopped. A resistor 33 is, therefore, connected in parallel to the base-emitter path of control transistor 32. Resistor 33 has about 600 ohms. The power output transistor 25 has resistor 27 of about 150 ohms connected in parallel to the emitter-base path thereof. The resistor insures that the Darlington transistor combination LT is completely blocked when the voltage between lines 20 and 23 has reached the desired level, and the control transistor 32, therefore, has been made conductive by conduction of the Zener diode 34.

The diode 19 located in parallel to the field winding 14 of the alternator 10 is formed on a third semi-conductor chip 50. The lower surface of chip 50 is metallized throughout its extent and forms the anode terminal of the diode 19.

The free-wheeling diode 19 and the entire regulator R, formed of the power stage LT and the control stage ST is located in a single housing G. Housing G consists of a metallic socket or base plate 51 and a cap 52 secured thereto by welding, as shown shcematically at W in FIG. 4. The first semi-conductor chip 28 on which the Darlington transistor LT is formed and the third semi-conductor chip 50 on which the free-wheeling diode 19 is formed are secured to the base plate 51 in good electrical and heat conductive contact; preferably, they are soldered thereto, or otherwise bonded thereto (see FIG. 3). The base plate 51 thus forms the junction terminal 53 (FIG. 1) of the collector 29 of the Darlington transistor LT and the anode of the free-wheeling shunt diode 29. The second semi-conductor chip 36 including the control stage ST is adhesively secured to a ceramic plate 40 (FIG. 4) which, in turn, is adhesively secured to the base plate or socket plate 51.

Two metallic externally projecting contact plugs $K_1$, $K_2$ are sealed with glass seals $F_1$, $F_2$ respectively, through the suitable openings in the base or socket plate 51, so that they are mechanically sealed and secured to the base plate or socket 51, while being insulated therefrom.

The first semi-conductor chip 28 has two metallic terminals 30, 31 at its topside, terminals 30 forming the emitter and terminals 31 the base of the Darlington transistor combination LT.

The second semi-conductor chip 36 has three metallic terminals A, B and D. The first metallic terminal A forms one of the three terminals of the voltage divider 35. The second metallic terminal B is the common connection for the second free end of the voltage divider 35 and of the emitter of control transistor 32. The third terminal D forms the collector of the control transistor 32.

The third semi-conductor chip 50 has only a single metallic terminal 54 as its topside, forming the cathode connection of the free-wheeling diode 19.

Ceramic chip 40 has formed two conductive strips 55, 56 at its top surface. Strips 55, 56 may be made in any suitable way, for example as thin films, or in thick film form. The actual arrangement of the conductive regions 55, 56 on the top side of plate 40 is best seen in FIG. 3; FIG. 2 only shows the conductive strips in schematic representation, as contact dots.

The electrically conductive connection between the top sides of the semi-conductor chips 28, 36 and 50, that is, contact dots or zones 30, 31, A, B, D, 54, with the terminal plugs $K_1$ and $K_2$ as well as with the conductive strips 55, 56 at the top side of ceramic plate 40 is effected by bonding wires $W_1$, $W_2$, $W_3$, $W_4$, $W_5$, $W_6$, $W_7$.

The first bonding wire $W_1$ connnects the emmiter terminal 30 of the Darlington transistor LT on semiconductor chip 28 to the end surface of contact terminal plug $K_1$. The second bonding wire $W_2$ extends from the connecting surface of the second terminal plug element $K_2$ to the top side of the third semi-conductor chip 50, that is, to the cathode terminal 54 of the free-wheeling diode 19. Bonding wires $W_1$ and $W_2$ are thicker than the remaining bonding wires since they have to carry a comparatively much higher current. Bonding wire $W_3$ connects the first terminal $K_1$ to the terminal B of the second semi-conductor chip 36 (see FIG. 3), the fourth bonding wire $W_4$ extends from the surface of the second terminal plug $K_2$ to the second conductive path 56 on ceramic plate 40. The fifth bonding wire $W_5$ connects between the base terminal 31 of the first chip 28 and the first conductive strip 55 on the ceramic plate 40. The sixth bonding wire $W_6$ extends from the first conductive strip 55 to the terminal D of the second semi-conductor chip 36. The seventh bonding wire $W_7$ leads from the second conductive path 56 on ceramic plate 40 to the terminal A of the second semi-conductor chip 36.

The invention is not restricted to the specific example shown in the drawing. The regulator R may include other passive or active elements, or both, besides the power semi-conductor LT and the IC portion ST, all of which can be located within the housing G. They may be applied, for example, to the ceramic plate 40. Passive circuit elements can be made either in thin film or thick film technology; the active circuit elements may be discrete elements secured to the ceramic plate 40. The control portion ST which is formed on the second chip 36 may additionally include one or more passive and/or active circuit elements which are integrated thereon in IC form, without departing from the scope of the invention. The circuit elements may, additionally, have other functions, or additional functions, for example they may be used to compensate for frequency changes, or to compensate for quiescent and internal currents. When using additional circuit elements which are not integrated in the control portion ST in IC form, the semiconductor chips 36 can be formed with further metallic terminal connections at its upper side beside those shown in the drawings, namely A, B and D. Electrically conductive connection to the semi-conductor chips 28, 30, 36 and the post-like plug elements $K_1$, $K_2$ may use other connecting elements than those shown, namely bonding wires. Thus, various change within the scope of the inventive concept.

We claim:

1. Solid state regulated power supply system having a shunt excited ac generator (10) subject to widely varying drive speeds, including a shunt field (14); comprising
   a free-wheeling bypass diode (19) connected in parallel with the field (14);
   a voltage regulator (R) connected to the output of the generator and further connected to intermittently control energization of the field (14) including a power semi-conductor (LT) in series with the field (14), a comparator and control stage (ST) connected to and comparing the output voltage of the alternator with a reference (35) and controlling conduction of the power semi-conductor (LT), a first integrated circuit (IC) monolithic chip (28) on which the power semi-conductor (LT) is formed and a second IC monolithic chip (36) on which the comparator and control stage (ST) is formed,
   a single, hermetically sealed housing (G, 51, 52) including a metal base plate (51) and a housing cover, or cap (52) sealed thereto;
   a third IC monolithic chip (50) on which the free-wheeling diode (19) is formed;
   the first, second and third monolithic chips (28, 36, 50) being all located within the sealed housing (G; 51, 52) whereby the entire voltage regulator and the free-wheeling diode is included as a single electrically complete unit in a single sealed housing;
   externally projecting terminal posts ($K_1$, $K_2$) sealed to the housing (G; 51, 52) and insulated therefrom;
   first connecting means connecting the collector (29) of the power semi-conductor (LT) internally within the housing to the metal base plate (51);
   second connecting means connecting one of the terminals of the free-wheeling diode (29) internally within the housing to the metal base plate (51);
   third connecting means connecting one of the terminals of the shunt field (14) to the metal base plate (51), whereby the metal base plate (51) of the housing (G; 51, 52) will form a common terminal (53) for the collector (29) of the power semi-conductor (LT), one terminal of the free-wheeling diode (19) and one terminal of the shunt field (14);
   fourth connecting means ($W_1$) connecting the emitter of the power semi-conductor (LT) to one of the terminal posts ($K_1$);
   fifth connecting means ($W_2$) connecting the other terminal of the free-wheeling diode to the other terminal post ($K_2$) for connection to the other terminal field (14);
   internal connecting means ($W_3$–$W_7$) interconnecting the first and second monolithic chips and additionally interconnecting said second chip and said terminal posts; the first and third IC monolithic chips (28, 50) being secured with one side thereof to the metal base plate (51) of the housing (G) in good electrical and heat conductive contact;
   and an insulating plate (40) secured to the metal base plate (51), the second IC monolithic chip (36) being secured to the insulating plate to position the second IC monolithic chip within the housing in insulated relation with respect thereto.

2. System according to claim 1 wherein the first and third IC chips (28, 50) are soldered to the metal base plate (51) and said insulating plate (40) comprises a ceramic plate.

3. System according to claim 1 wherein the first and third IC chips (28, 50) are bonded to the metal base plate (51) and said insulating plate (40) comprises a ceramic plate.

4. System according to claim 1 wherein the internal connecting means ($W_3 \ldots W_7$) are bonding wires;
   and the upper surfaces of the semi-conductor chips (28, 36, 50) are formed with metallic connecting dots or zones (30, 31, A, B, D, 54) providing attachment points to said bonding wires, said bonding wires being additionally connected, selectively, to the terminal posts ($K_1$, $K_2$).

5. System according to claim 4, wherein the power semiconductor (LT) comprises a Darlington transistor.

6. System according to claim 5 wherein the free surface of the insulating plate (40) is formed with surface conductive paths (55, 56), and some of said bonding wires (55, 56) terminate on said conductive paths to form a complete electrical circuit within the housing (G; 51, 52), the conductive paths forming intermediate connection strips.

7. System according to claim 6 wherein the insulating plate is a ceramic plate, and said conductive paths (55, 56) are formed in film technology comprising at least one of: thick film; thin film.

8. System according to claim 1 wherein the power semi-conductor (LT) comprises a Darlington transistor.

9. System according to claim 7 wherein the first and third IC monolithic chips (28, 50) are secured with one side thereof to the metal base plate (51) in good electrical and heat conductive contact.

10. A system according to claim 9 wherein the power semi-conductor (T) comprises a Darlington transistor.

* * * * *